(12) United States Patent
Fukunaga et al.

(10) Patent No.: US 6,433,374 B1
(45) Date of Patent: Aug. 13, 2002

(54) LIGHT RECEIVING DEVICE WITH BUILT-IN CIRCUIT

(75) Inventors: Naoki Fukunaga, Soraku-gun; Kazuhiro Natsuaki, Sakurai, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/984,298

(22) Filed: Oct. 29, 2001

(30) Foreign Application Priority Data

Oct. 31, 2000 (JP) .................................... 2000-334016
Sep. 12, 2001 (JP) .................................... 2001-277312

(51) Int. Cl.[7] .................. H01L 31/062; H01L 31/113
(52) U.S. Cl. ............... 257/292; 257/291; 257/446; 257/463
(58) Field of Search ................. 257/290, 291, 257/292, 446, 461, 463

(56) References Cited

U.S. PATENT DOCUMENTS

| 5,283,460 A | * | 2/1994 | Mita | 257/432 |
| 6,252,286 B1 | * | 6/2001 | Arai | 257/446 |
| 6,313,484 B1 | * | 11/2001 | Ohkubo et al. | 257/79 |

FOREIGN PATENT DOCUMENTS

| JP | 3-91959 A | 4/1991 |
| JP | 11-251567 A | 9/1999 |

* cited by examiner

*Primary Examiner*—Ngân V. Ngô
(74) *Attorney, Agent, or Firm*—Nixon & Vanderhye, P.C.

(57) ABSTRACT

A photodiode converts light incident thereon into an electric signal by a junction between an N-type epitaxial layer and a P-type epitaxial layer with a sufficiently small junction capacitance. The photodiode is surrounded by a $P^+$-type buried isolating diffused layer and a P-type isolating diffused layer, and thus is electrically separated from a signal processing circuit including a MOS transistor.

20 Claims, 9 Drawing Sheets

LIGHT RECEIVING DEVICE WITH BUILT-IN CIRCUIT

BACKGROUND OF THE INVENTION

1. Field of the Invention

The present invention relates to a light receiving device with a built-in circuit including a light receiving element (photodiode) for converting light incident thereon into an electric signal and a signal processing circuit, including at least a MOS transistor, for processing a signal output from the light receiving element, the light receiving element and the signal processing circuit being provided on a single substrate. The present invention specifically relates to a light receiving device with a built-in circuit for increasing the response speed of the light receiving element and suppressing malfunction of the MOS transistor.

2. Description of the Related Art

Conventionally, semiconductor devices such as light receiving devices with a built-in circuit, are used in the fields of, for example, optical pickups, optical fibers and photo-couplers. Due to the recent increase in the operating speed of CD-ROM, CD-R/RW and DVD-ROM drives and the like, optical pickups now require a high performance light receiving element with a built-in circuit having superior characteristics including high sensitivity, low noise and high response speed. Optical fibers also require a high performance light receiving element with a built-in circuit in order to deal with the increased speed of data transfer.

Figure 10:
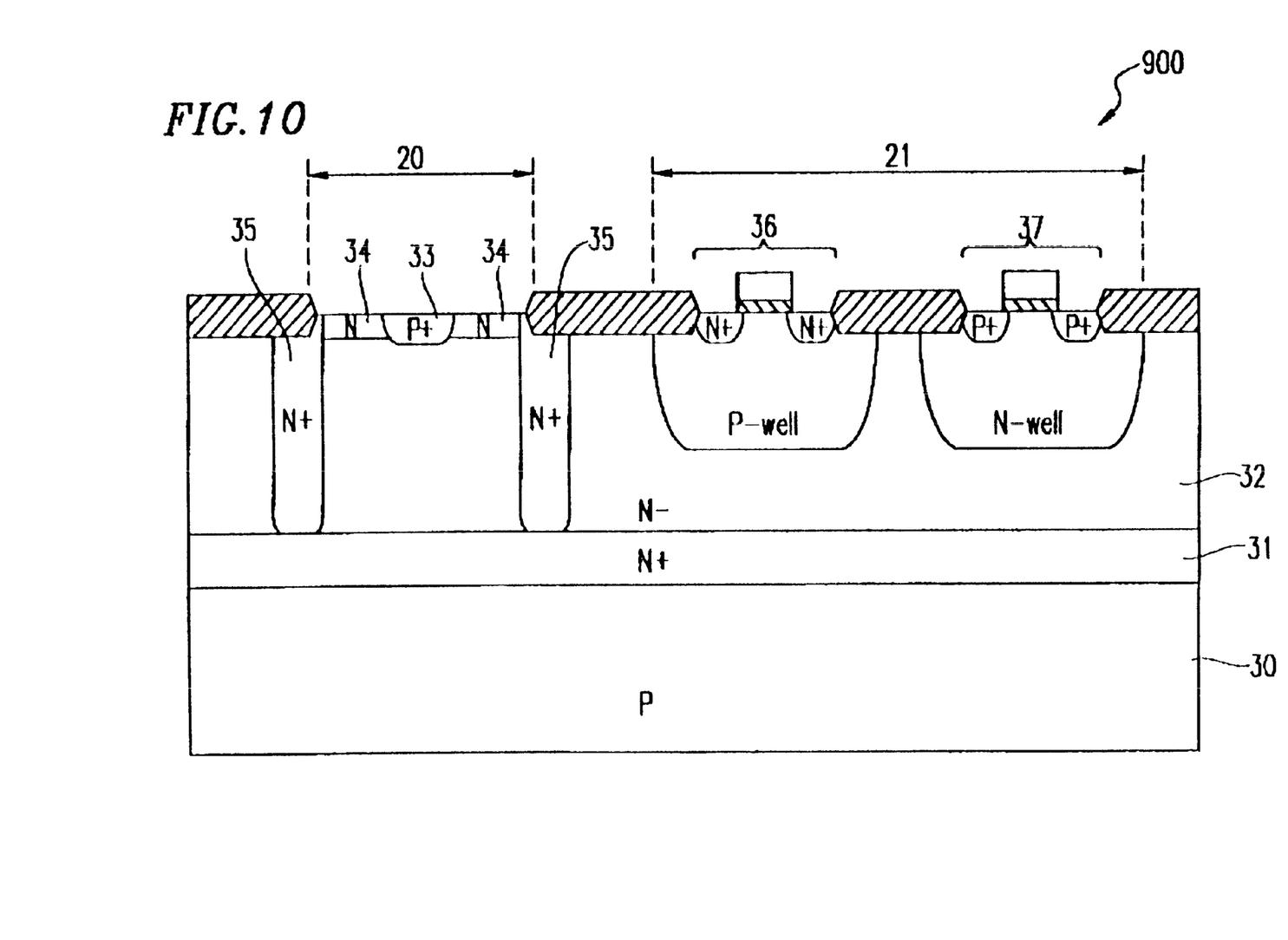
FIG. 10 is a cross-sectional view illustrating a conventional light receiving device with a built-in circuit.

FIG. 10 shows an exemplary light receiving device with a built-in circuit 900 including a light receiving element and a signal processing circuit provided on a single substrate. The light receiving device with a built-in circuit 900 is described in Japanese Laid-Open Publication No. 11-251567.

The light receiving device with a built-in circuit 900 shown in FIG. 10 includes a P-type semiconductor substrate 30, an N$^+$-type buried diffused layer 31 laminated on the entirety of a surface of the P-type semiconductor substrate 30, and an N$^-$-type epitaxial layer 32 laminated on the N$^+$-type buried diffused layer 31. The light receiving device with a built-in circuit 900 includes a peripheral circuit 21 as a signal processing circuit and a photodiode 20 as a light receiving element. The peripheral circuit 21 and the photodiode 20 are partially provided in an upper portion of the N$^-$-type epitaxial layer 32. The peripheral circuit 21 includes MOS transistors 36 and 37, and the photodiode 20 is provide adjacent to the peripheral circuit 21. The photodiode 20 includes, for example, a light receiving area including a P$^+$-type region 33 and N type regions 34, and N$^+$-type diffused regions 35.

The light receiving device with a built-in element 900 having the structure shown in FIG. 10 functions as follows. The N$^+$-type buried diffused layer 31 and N$^+$-type diffused regions 35 together form a potential barrier surrounding the photodiode 20. The potential barrier prevents stray carriers generated in channel regions of the MOS transistors 36 and 37 of the peripheral circuit 21 from entering the photodiode 20, and thus reduces fixed pattern noise (FPN).

The light receiving device with a built-in element 900 having the structure shown in FIG. 10 also functions as follows. Since the N$^+$-type buried diffused layer 31 has a conductivity type which is opposite to the conductivity type of the P-type semiconductor substrate 30 and the photodiode 20 is provided on the N$^+$-type buried diffused layer 31, a P-N junction region is generated at an interface between the P-type semiconductor substrate 30 and the N$^+$-type buried diffused layer 31. The P-N junction region prevents stray carriers generated in the channel regions of the MOS transistors 36 and 37 of the peripheral circuit 21 from entering the photodiode 20, and thus reduces fixed pattern noise.

In developing a light receiving device with a built-in circuit handling signals having a very low amplitude, it is important to prevent stray carriers generated in the MOS transistors 36 and 37 from entering the photodiode 20 and also to prevent stray carriers generated in the photodiode 20 from entering the MOS transistors 36 and 37 and thus generating a wrong signal. Especially in the structure of having the MOS transistors 36 and 37 in the signal processing circuit, an electric current formed of optical carriers generated in the photodiode 20 are likely to flow into the channel regions of the MOS transistors 36 and 37. Therefore, even when the electric current formed of the optical carriers has a very small magnitude, there is an undesirable possibility of the light receiving device malfunctioning.

The light receiving device with a built-in circuit 900 having the above-described structure includes the following problems.

In general, by a usual MOS process, MOS transistors are formed in a P-type semiconductor substrate having a low specific resistance, in order to prevent a latch-up phenomenon which is caused by a parasitic operation between the MOS transistors by stabilizing the entire surface of the P-type semiconductor substrate at the GND potential.

Conversely, the light receiving device with a built-in circuit 900 shown in FIG. 10 includes the N$^+$-type buried diffused layer 31 provided on the entire surface of the P-type semiconductor substrate 30. Therefore, the P-type semiconductor substrate 30, which needs to be stabilized at the GND potential, is electrically separated from the N$^-$-type epitaxial layer 32 in which the MOS transistors 36 and 37 are formed. The N$^-$-type epitaxial layer 32 is significantly thinner and thus has a higher specific resistance than the P-type semiconductor substrate 30. Therefore, the N$^-$-type epitaxial layer 32 has a significantly high resistance in a lateral direction, which is parallel to a surface of the N$^-$-type epitaxial layer 32. In such a structure, a latch-up phenomenon is very likely to occur. When the latch-up phenomenon occurs, the electric current continues to flow in the chip until the high supply voltage is turned off. As a result, the peripheral circuit 21 does not operate normally. When the electric current continues to flow by the high supply voltage, the temperature of the chip may possibly become abnormally high.

As described above, the N$^+$-type diffused regions 35 provided so as to surround a light receiving region of the photodiode 20 are in contact with the N$^+$-type buried diffused layer 31, and therefore prevent stray carriers generated in the MOS transistors 36 and 37 from entering the photodiode 20. The N$^+$-type diffused regions 35 extend from the surface of the N$^-$-type epitaxial layer 32 to an interface between the N$^-$-type epitaxial layer 32 and the N$^+$-type buried diffused layer 31. In order to extend the N$^+$-type diffused regions 35 to the N$^+$-type buried diffused layer 31, the thickness of the N-type epitaxial layer 32 is about 5 $\mu$m at most due to the diffusion coefficient of the carriers with respect to the N$^+$-type diffused regions 35. In such a case, a diffusion current component formed by optical carriers which are generated in the vicinity of the P-N junction region at an interface between the P-type semiconductor substrate 30 and the N$^+$-type buried diffused layer 31 exerts the strongest influence on the response speed of the photodiode 20. Since the optical carriers are recombined with the holes by the P-N junction of the P-type semiconductor substrate 30 and the $N^+$-type buried diffused layer 31, the response speed of the photodiode 20 can be increased.

However, optical carriers which are generated by the light incident on the photodiode 20 are mostly generated in a lower portion of the $N^+$-type buried diffused layer 31. Such optical carriers do not contribute to form a photocurrent, which significantly reduces the photoelectric conversion efficiency of the photodiode 20. For example, incident light having a wavelength of 650 nm, which is used in a common optical pickup or the like, penetrates into the photodiode 20 down to a position of a depth of about 4 $\mu$m from the surface of the photodiode 20. Therefore, in the case where the $N^-$-type epitaxial layer 32 has a thickness of 5 $\mu$m, about 30% of the incident light does not contribute to form a photocurrent. This significantly reduces an S/N ratio, which represents a characteristic of the photodiode 20 with respect to noise.

In the light receiving device with a built-in circuit 900 shown in FIG. 10, optical carriers which are generated at a position relatively deep in the photodiode 20, or more specifically, in the P-type semiconductor substrate 30 below the $N^+$-type buried diffused layer 31, so astray, migrating towards the MOS transistors 36 and 37. However, such optical carriers are recombined with holes by the P-N junction of the $N^+$-type buried diffused layer 31 and the P-type semiconductor substrate 30 and thus disappear. In this manner, the stray optical carriers are prevented from entering the MOS transistors 36 and 37, and thus the MOS transistors 36 and 37 are prevented from malfunctioning. However, when the optical carriers disappear, the photosensitivity of the photodiode 20 is reduced, resulting in reduction i the S/N ratio thereof. The light receiving device with a built-in circuit 900 also has a problem that a latch-up phenomenon is likely to occur since the $N^-$-type epitaxial layer 32 has a thickness of as small as 5 $\mu$m as compared to the usual thickness of the semiconductor substrate 30 of about 600 $\mu$m.

In order to give priority to the response speed and photosensitivity of the photodiode 20, namely, for example, in order to absorb about 90% of light having a wavelength of 650 nm and remove only a diffusion current component, the $N^-$-type epitaxial layer 32 is required to have a thickness of about 12 $\mu$m. Such a structure has a problem that although the photodiode 20 can prevent the stray optical carriers generated in a lower portion of the $N^+$-type buried diffused layer 31 of the photodiode 20 from migrating, but cannot put the $N^+$-type diffused regions 35 into contact with the $N^+$-type buried diffused layer 31. As a result, optical carriers generated in the photodiode 20 flow into the channel regions of the MOS transistors 36 and 37. This increases the undesirable possibility of the MOS transistors 36 and 37 malfunctioning. Even the thickness of the $N^-$-type epitaxial layer 32 of about 12 $\mu$m is not sufficient to suppress generation of the latch-up phenomenon. In addition, heat treatment, which is required to be performed for an extended period of time in order to put the $N^+$-type diffused regions 35 into contact with the $N^+$-type buried diffused layer 31, is not very preferable. The reason for this is because heat treatment performed for an extended period of time excessively diffuses the $N^+$-type diffused regions 35 and thus increases the area of the photodiode 20 as well as the area of the chip.

Japanese Laid-Open Publication No. 3-91959 discloses a structure of using a source diffused region and a drain diffused region of an N-type MOS transistor as the surface regions of a photodiode (corresponding to the $P^+$-type region 33 and N type regions 34 in this example). In this structure, the source diffused region and the drain diffused region of the N-type MOS transistor are used as a cathode electrode of the photodiode, and a P-well diffused region and a P-type buried diffused layer provided below the P-well diffused region are used as an anode electrode of the photodiode. Due to such a structure, the source and drain diffused regions of the N-type MOS transistors can be shallow with a thickness of about 0.2 $\mu$m to 0.4 $\mu$m, and thus the photodiode 20 can maintain a high level of photosensitivity to light having a short wavelength.

A photodiode having such a structure has a peak photosensitivity at a short wavelength and thus improves the photosensitivity to light having a short wavelength, but has the following problem. The P-type diffused layer and the P-type buried diffused layer have a total thickness of 1.0 $\mu$m to 1.5 $\mu$m. Due to the potential barrier generated by the P-type buried diffused layer, optical carriers, which are generated at a position deeper than a position in the P-type buried diffused layer having a peak in the impurity concentration, for example, at a position deeper than a position of a depth of 1.5 $\mu$m from the surface of the photodiode, do not contribute to form a photocurrent. In this case, the photosensitivity of the photodiode to light having a long wavelength may be significantly reduced. In the case of where, for example, the photodiode uses light having a wavelength of 650 nm (which is used in optical pickups for DVD-ROMs or the like. Optical fiber links, photocouplers or the like), only about 30% of light incident on the photodiode contributes to form a photocurrent. Even when, for example, the thickness of an epitaxial layer is increased to about 3.0 $\mu$m in order to avoid deterioration of various characteristics of the MOS transistors and NPN transistors, only 50% of light incident on the photodiode contributes to form a photocurrent in the case where light having a wavelength of 650 nm is used.

In the field of optical pickups used for DVD-ROMs or the like, the wavelength of light used is now being shortened from infrared to red and to blue, in order to increase the data recording density. The structure disclosed in Japanese Laid-Open Publication No. 3-91959 is usable with no practical problem for a special system only for reading light having a short wavelength. By contrast, in the case of pickups for DVD-ROMs or the like, it is necessary to read both light having a short wavelength (such as, for example, blue light) and light having a long wavelength (i.e., red and infrared light). The structure disclosed in Japanese Laid-Open Publication No. 3-91959 may undesirably reduce the photosensitivity to light having a long wavelength and thus significantly deteriorate the S/N ratio.

The structure disclosed in Japanese Laid-Open Publication No. 3-91959 also has the following problem. As described above, the source diffused region and the drain diffused region of the N-type MOS transistor are used as a cathode electrode of the photodiode, and the P-well diffused region and the P-type buried diffused region below the P-well diffused region are used as an anode electrode of the photodiode. Therefore, when the photodiode is supplied with an inverted bias voltage, the depletion layer only expands to about 1.0 $\mu$m to 2.0 $\mu$m, which is not sufficient. When the depletion layer expands only to such a degree, the junction capacitance of the photodiode increases and thus the response speed of the photodiode decreases. For optical pickups for DVD-ROMs or the like using blue light, the direct current-like photosensitivity to light having a short wavelength is important. However, the low response speed of the photodiode is a serious problem since DVD-ROMs use a frequency band of as high as at least 100 MHz.

SUMMARY OF THE INVENTION

A light receiving device with a built-in circuit includes a first conductivity type semiconductor lamination structure; a photodiode for converting light incident thereon to an electric signal by a junction with a first second conductivity type semiconductor layer provided on the first conductivity type semiconductor lamination structure for processing the electric signal obtained by the photoelectric conversion; and a signal processing circuit provided in a region different from the photodiode. The first conductivity type semiconductor lamination structure includes a first conductivity type semiconductor substrate, a first first conductivity type semiconductor layer provided on the first conductivity type semiconductor substrate and having a higher impurity concentration than the first conductivity type semiconductor substrate, and a second first conductivity type semiconductor layer provided on the first first conductivity type semiconductor layer and having a lower impurity concentration than that of the first first conductivity type semiconductor layer. The photodiode is provided in a region surrounded by a third first conductivity type semiconductor layer provided so as to substantially contact a surface of the first first conductivity type semiconductor layer and a fourth first conductivity type semiconductor layer extended from a surface of the first second conductivity type semiconductor layer so as to reach the third first conductivity type semiconductor layer. The signal processing circuit includes at least a MOS structure transistor.

In one embodiment of the invention, the light receiving device with a built-in circuit further includes a fifth first conductivity type semiconductor layer provided below the third first conductivity type semiconductor layer in the state of overlapping at least a portion of the third first conductivity type semiconductor layer, the fifth first conductivity type semiconductor layer running through the second first conductivity type semiconductor layer and reaching at least the first first conductivity type semiconductor layer.

In one embodiment of the invention, the second first conductivity type semiconductor layer has a high specific resistance.

In one embodiment of the invention, the second first conductivity type semiconductor layer has a specific resistance of 200 Ω·cm or more.

In one embodiment of the invention, the light receiving device with a built-in circuit further includes a second second conductivity type semiconductor layer at a surface of the first second conductivity type semiconductor layer.

In one embodiment of the invention, the signal processing section includes an N-type MOS transistor provided so as not to be adjacent to the photodiode.

In one embodiment of the invention, the signal processing section further includes a P-type MOS transistor between the N-type MOS transistor and the photodiode.

In one embodiment of the invention, the signal processing section includes one of the first second conductivity type semiconductor layer and the second second conductivity type semiconductor layer between the N-type MOS transistor and the photodiode. The one of the first second conductivity type semiconductor layer and the second second conductivity type semiconductor layer is set to be at an equal potential to that of the third first conductivity type semiconductor layer.

In one embodiment of the invention, the signal processing section includes one of the first second conductivity type semiconductor layer and the second second conductivity type semiconductor layer between the N-type MOS transistor and the photodiode. The one of the first second conductivity type semiconductor layer and the second second conductivity type semiconductor layer is set to be at a higher potential than that of the third first conductivity type semiconductor layer.

In one embodiment of the invention, the second second conductivity type semiconductor layer is obtained as a result of performing a step of forming a source region and a drain region of the MOS structure transistor.

In one embodiment of the invention, the second second conductivity type semiconductor layer is obtained as a result of diffusion processing performed at least once.

In one embodiment of the invention, the light receiving device with a built-in circuit further includes a sixth first conductivity type semiconductor layer at a surface of the first second conductivity type semiconductor layer.

In one embodiment of the invention, the first second conductivity type semiconductor layer has a substantially uniform impurity concentration in a region below the second second conductivity type semiconductor layer.

In one embodiment of the invention, the first second conductivity type semiconductor layer has a high specific resistance.

In one embodiment of the invention, the first second conductivity type semiconductor layer has a specific resistance of 3.0 Ω·cm or higher.

In one embodiment of the invention, the light receiving device with a built-in circuit further includes a second conductivity type well diffused layer below the second second conductivity type semiconductor layer.

In one embodiment of the invention, the light receiving device with a built-in circuit further includes a first conductivity type well diffused below the sixth first conductivity type semiconductor layer.

In one embodiment of the invention, the second conductivity type well diffused layer is obtained as a result of performing a step of forming a well region of the MOS structure transistor.

In one embodiment of the invention, the first conductivity type well diffused layer is obtained as a result of performing a step of forming a well region of the MOS structure transistor.

In one embodiment of the invention, the light receiving device with a built-in circuit further includes a third second conductivity type semiconductor layer between the first second conductivity type semiconductor layer and the second first conductivity type semiconductor layer.

Thus, the invention described herein makes possible the advantages of providing a light receiving device with a built-in circuit, including a photodiode which has a high level of photosensitivity to light having a short wavelength and is capable of high speed operation, the light receiving device with a built-in circuit preventing optical carriers generated in the photodiode from entering a MOS device and also preventing a latch-up phenomenon.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

Figure 1:
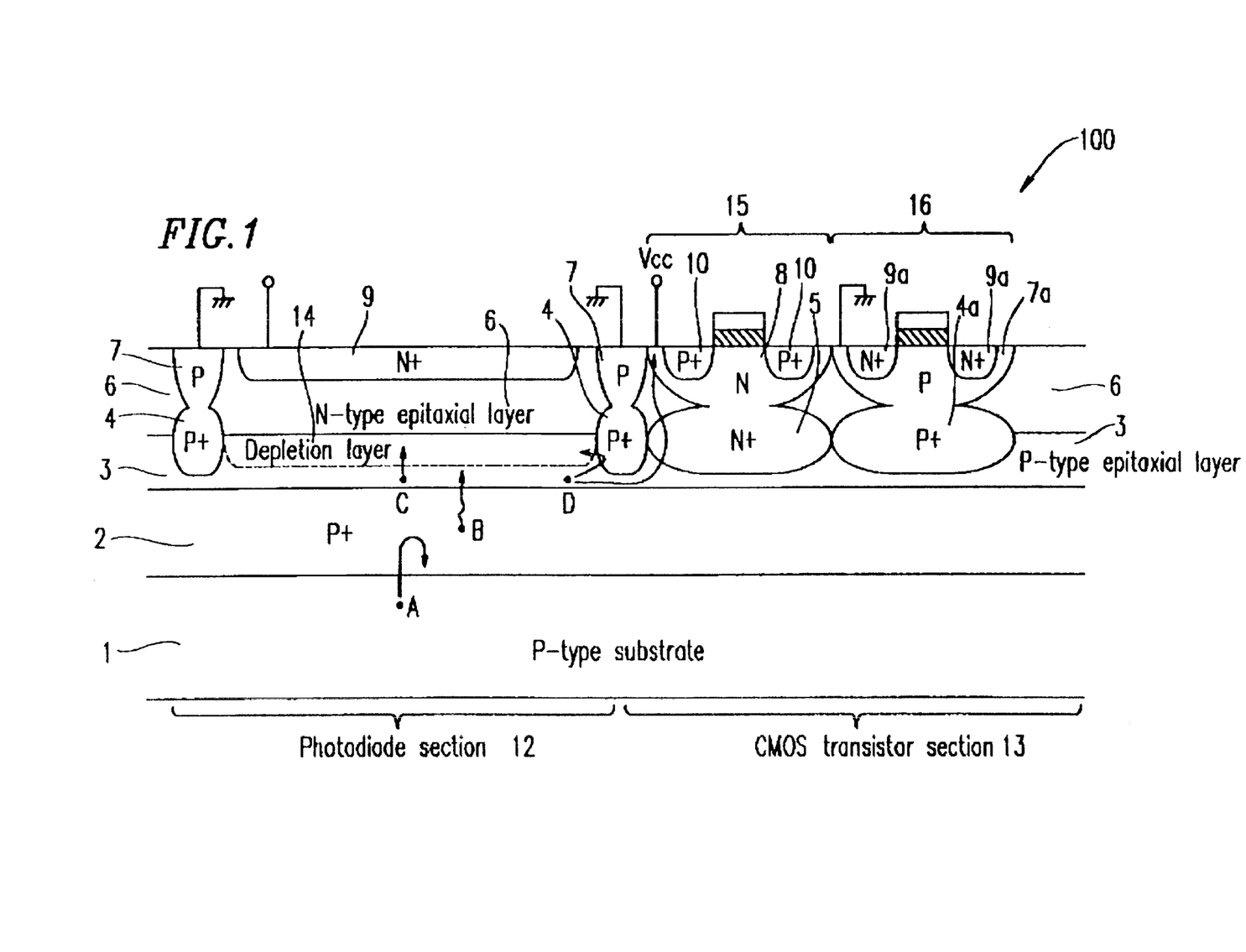
FIG. 1 is a cross-sectional view illustrating a structure of a light receiving device with a built-in circuit according to a first example of the present invention.

FIG. 1 is a cross-sectional view illustrating a light receiving device with a built-in circuit 100 according to a first example of the present invention.

With reference to FIG. 1, the light receiving device with a built-in circuit 100 includes a photodiode section 12 for converting light incident thereon into an electric signal, an a CMOS transistor section 13 acting as a integrated circuit for processing the electric signal. In the figures provided herein, an oxide layer such as, for example, a surface protection layer is not shown for the sake of simplicity.

The light receiving device with a built-in circuit 100 includes a P-type semiconductor substrate 1 (resistance value: 40 Ω·cm; a first conductivity type semiconductor substrate), a P$^+$-type buried diffused layer 2 (a first first conductivity type semiconductor layer) having a high impurity concentration and a low resistance (resistance value: 0.01 Ω·cm), a P-type epitaxial layer 3 (a second first conductivity type semiconductor layer) having a significantly low impurity concentration and a high resistance (resistance value: 1000 Ω·cm), and an N-type epitaxial layer 6 (resistance value: about 3 Ω·cm; a first second conductivity type semiconductor layer). Although the specific resistance of the P-type epitaxial layer 3 is 1000 Ω·cm in this example, the P-type epitaxial layer 3 may have a specific resistance of 200 Ω·cm or more. The P$^+$-type buried diffused layer 2, the P-type epitaxial layer 3 and the N-type epitaxial layer 6 are sequentially laminated on the P-type semiconductor substrate 1 in this order. In the P-type epitaxial layer 3, a P$^+$-type buried isolating diffused layer 4 (a third first conductivity type semiconductor layer) surrounding the photodiode section 12 is provided. In the N-type epitaxial layer 6, a P-type isolating diffused layer 7 (a fourth first conductivity type semiconductor layer) is provided on the P$^+$-type buried isolating diffused layer 4. A surface of the P-type isolating diffused layer 7 is exposed at the same level as a surface of the N-type epitaxial layer 6. An anode electrode (not shown) is provided on the exposed surface of the P-type isolating diffused layer 7, so that the P-type isolating diffused layer 7 is at an anode potential (i.e., the GND potential). The P$^+$-type buried isolating diffused layer 4 and the P-type isolating diffused layer 7 are formed by an ion doping step and a subsequent heat diffusion step.

The photodiode section 12 includes a depletion layer 14, which is a P-N junction region, provided at an interface between the P-type epitaxial layer 3 and the N-type epitaxial layer 6. An N$^+$-type diffused layer 9 (a second second conductivity type semiconductor layer) is provided at the surface of the N-type epitaxial layer 6. A surface of the N$^+$-type diffused layer 9 is exposed at the same level as a surface of the N-type epitaxial layer 6. A cathode electrode (not shown) is provided on the exposed surface of the N$^+$-type diffused layer 9.

Signal processing circuits included in the light receiving device with a built-in circuit 100 include the CMOS transistor section 13. The CMOS transistor section 13 includes a P-type MOS transistor 15 and an N-type MOS transistor 16.

The N-type MOS transistor 16 includes a P$^+$-type buried isolating diffused layer 4a provided in the P-type epitaxial layer 3 and the N-type epitaxial layer 6 across an interface between the layers 3 and 6. The N-type MOS transistor 16 also includes a P-type isolating diffused layer 7a buried in the N-type epitaxial layer 6. The P-type isolating diffused layer 7a is provided on the P$^+$-type buried isolating diffused layer 4a. A surface of the P-type isolating diffused layer 7a is exposed at the same level as the surface of the N-type epitaxial layer 6. An electrode pattern is provided on the surface of the P-type isolating diffused layer 7a, so that the P-type isolating diffused layer 7a is set to be at an anode potential like the P-type isolating diffused layer 7. A pair of N$^+$-type diffused layers 9a are provided at the surface of the P-type isolating diffused layer 7a. One of the N$^+$-type diffused layers 9a acts as a source region, and the other N$^+$-type diffused layer 9a acts as a drain region. A surface of each N$^+$-type diffused layer 9a is exposed at the same level as a surface of the P-type isolating diffused layer 7a, and an electrode is provided on the exposed surface of each N$^+$-type diffused layer 9a. A region between the pair of N$^+$-type diffused layers 9a acts as a channel region.

The P-type MOS transistor 15 includes an N$^+$-type buried diffused layer 5 provided in the P-type epitaxial layer 3 and the N-type epitaxial layer 6 across an interface between the layers 3 and 6. The P-type MOS transistor 15 also includes an N-type diffused layer 8 buried in the N-type epitaxial layer 6. The N-type diffused layer 8 is provided on the N$^+$-type buried diffused layer 5. A surface of the N-type diffused layer 8 is exposed at the same level as the surface of the N-type epitaxial layer 6. An electrode pattern is provided on the surface of the N-type diffused layer 8, so that the N-type diffused layer 8 is supplied with a supply voltage Vcc having a high potential. A pair of P$^+$-type diffused layers 10 are provided at the surface of the N-type diffused layer 8. One of the P$^+$-type diffused layers 10 acts as a source region, and the other P$^+$-type diffused layer 10 acts as a drain region. A surface of each P$^+$-type diffused layer 10 is exposed at the same level as a surface of the N-type diffused layer 8, and an electrode is provided on the exposed surface of each P⁺-type diffused layer 10. A region between the pair of P⁺-type diffused layers 10 acts as a channel region.

The light receiving device with a built-in circuit 100 having the above-described structure functions as follows.

Optical carriers A, which are generated in the P-type semiconductor substrate 1 at a position deeper than a position in the P⁺-type buried diffused layer 2 (having a high impurity concentration) having a peak impurity concentration, cannot go over a potential barrier generated by a profile of the impurity concentration of the P⁺-type buried diffused layer 2 and is pushed back to the P-type semiconductor substrate 1. Then, the optical carriers A are recombined with holes and thus disappear. Therefore, the stray optical carriers A are prevented from migrating toward the CMOS transistor section 13. A position having a peak impurity concentration will be referred to as a "peak position".

Optical carriers B, which are generated in the P⁺-type buried diffused layer 2 at a position shallower than the peak position is led to the depletion layer 14 (as the P-N junction region) at a high speed by a built-in electric field generated by the potential of the P⁺-type buried diffused layer 2. Thus, the optical carriers B form a photocurrent.

A great number of optical carriers C, which are generated in the P-type epitaxial layer 3, are led to the depletion layer 14 and thus form a photocurrent. A part of the optical carriers C, hereinafter, D, migrate astray toward the CMOS transistor section 13. However, most of the stray optical carriers D are pushed back toward the photodiode section 12 by a potential barrier generated by the P⁺-type buried isolating diffused layer 4 and form a photocurrent. Thus, such stray optical carriers D are prevented from entering the CMOS transistor section 13. A small number of stray optical carriers D which slip through the potential barrier generated by the P⁺-type buried isolating diffused layer 4 enter the CMOS transistor section 13, but are absorbed by the N⁺-type buried diffused layer 5 and the N-type diffused layer 5. The reason for this is because in the CMOS transistor section 13, the N-type diffused layer 8 is connected to the supply voltage Vcc having a high potential and as a result, the N⁺-type buried diffused layer 5 and the N-type diffused layer 8 are at a high voltage. In this manner, the CMOS transistor section 13 is prevented from malfunctioning.

In the first example, the N-type epitaxial layer 6 in the photodiode section 12 has a thickness of about 2 $\mu$m. The P-type epitaxial layer 3 contains a reaction composition, which is generated by a heat treatment step and a subsequent heat diffusion step performed on the P⁺-type buried diffused layer 2 in order to form the P-type epitaxial layer 3. A layer of the reaction composition has a thickness of about 10 $\mu$m. The P-type epitaxial layer 3 including the reaction composition layer has a thickness of about 12 $\mu$m to about 15 $\mu$m. A depth of the peak position in the P⁺-type buried diffused layer 2 from the surface of the N-type epitaxial layer 6 is about 14 $\mu$m to about 17 $\mu$m. Such a depth is sufficient to absorb most of the optical carriers. For this reason, the photosensitivity of the photodiode section 12 can be enhanced.

The P⁺-type buried isolating diffused layer 4 for separating the photodiode section 12 from the CMOS transistor section 13, and the P⁺-type buried isolating diffused layer 4a in the CMOS transistor section 13, are both diffused down to a position of a depth of about 1 $\mu$m to about 2 $\mu$m from a surface of the P-type epitaxial layer 3. Namely, the P⁺-type buried isolating diffused layers 4 and 4a are proximate to the P⁺-type buried diffused layer 2. Due to such a structure, the stray optical carriers generated in the photodiode section 12 can be prevented from entering the CMOS transistor section 13.

A low portion of the CMOS transistor section 13 includes the P⁺-type buried diffused layer 2 having a high impurity concentration and a low resistance, and the P-type epitaxial layer 3 laminated on the P⁺-type buried diffused layer 2. Due to such a structure, generation of a latch-up phenomenon can be suppressed in a similar manner to that of a typical CMOS process.

The N⁺-type diffused layer 9 provided at a surface of the photodiode section 12 is preferably formed in the step of forming the N⁺-type diffused layers 9a acting as a source region and a drain region of the N-type MOS transistor 16. Unlike the structure described in Japanese Laid-Open Publication No. 3-91959, the N⁺-type diffused layer 9 does not form a P-N junction region with a P-well diffused region. The depletion layer 14 acting as a P-N junction region of the photodiode section 12 is formed at an interface between the N-type epitaxial layer 6 and the P-type epitaxial layer 3 having a high specific resistance. The N⁺-type diffused layer 9 reduces the series resistance in order to realize the high speed operation of the photodiode section 12. Therefore, the photodiode section 12 can be produced by a simpler process and have an improved photosensitivity with respect to light having a short wavelength. Since the depletion layer 14 is formed at an interface between the N-type epitaxial layer 6 and the P-type epitaxial layer 3 having a high specific resistance, the depletion layer 14 largely expands in a direction vertical to the surface of the N-type epitaxial layer 6 and thus has only a small junction capacitance. This also realizes the high speed operation of the photodiode section 12.

EXAMPLE 2

Figure 2:
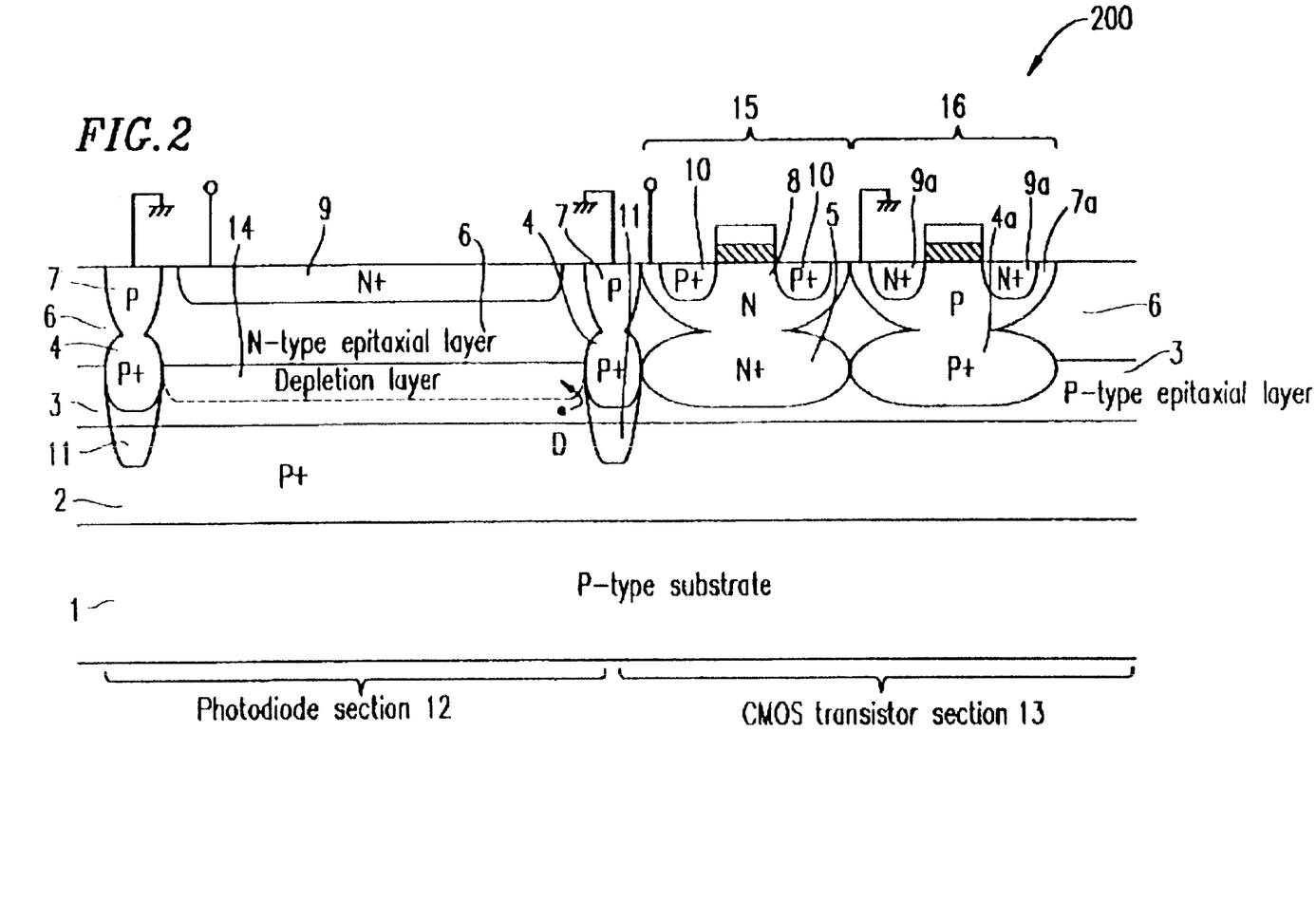
FIG. 2 is a cross-sectional view illustrating a structure of a light receiving device with a built-in circuit according to a second example of the present invention.

FIG. 2 is a cross-sectional view illustrating a light receiving device with a built-in circuit 200 according to a second example of the present invention.

The light receiving device with a built-in circuit 200 includes a P-type buried isolating diffused layer 11 (a fifth first conductivity type semiconductor layer) below the P⁺-type buried isolating diffused layer 4 surrounding the photodiode section 12. The P-type buried isolating diffused layer 11 penetrates into the P⁺-type buried diffused layer 2. More specifically, the P-type buried isolating diffused layer 11 overlaps at least a portion of the P⁺-type buried isolating diffused layer 4 and runs through the P-type epitaxial layer 3 to reach at least the P⁺-type burried diffused layer 2.

The light receiving device with a built-in circuit 200 has a similar structure to that of the light receiving device with a built-in circuit 100 shown in FIG. 1 on the other points.

The light receiving device with a built-in circuit 200 functions as follows.

Optical carriers D generated in the P-type epitaxial layer 3 are prevented with certainty from entering the CMOS transistor section 13 by a potential barrier formed of the P-type buried isolating diffused layer 11. Therefore, the CMOS transistor section 13 is prevented from malfunctioning with certainty. The P-type buried isolating diffused layer 11 also reduces the anode resistance of the anode electrode provided on the P-type isolating diffused layer 7 in the photodiode section 12, and therefore the photodiode section 12 can operate at a high speed. The P-type buried isolating diffused layer 11 also stabilizes the potential of the P-type semiconductor substrate 1 at a GND potential, and thus suppresses generation of a latch-up phenomenon.

In the light receiving devices with a built-in circuit 100 (FIG. 1) and 200 (FIG. 2), the junction capacitance of the photodiode section 12 is the junction capacitance of the depletion layer 14 acting as a P-N junction region between the P-type epitaxial layer 3 and the N-type epitaxial layer 6 both having a significantly low impurity concentration. Due to the significantly low impurity concentration of the P-type epitaxial layer 3 and the N-type epitaxial layer 6, the depletion layer 14 of the photodiode section 12 can largely expand in a direction vertical to the surface of the N-type epitaxial layer 6. As a result, most of the optical carriers generated in the P-type epitaxial layer 3 can be prevented from being diffused, and the junction capacitance of the photodiode section 12 can be reduced. Therefore, the photodiode section 12 can operate at a high speed.

In the light receiving devices with a built-in circuit 100 (FIG. 1) and 200 (FIG. 2), the P-type MOS transistor 15 is provided between the photodiode section 12 and the N-type MOS transistor 16. The channel region of the N-type MOS transistor 16 has the P-type isolating diffused layer 7a, and the P-type isolating diffused layer 7a is at the GND potential like the anode electrode provided on the P-type isolating diffused layer 7. Accordingly, in a structure including the N-type MOS transistor 16 adjacent to the photodiode section 12, the stray optical carriers slipping through the potential barrier in the $P^+$-type buried isolating diffused layer 4 to enter the CMOS transistor section 13 may undesirably jump in the channel region of the N-type MOS transistor 16 to cause malfunction of the CMOS transistor section 13. By contrast, in the structure of the first and second examples in which the P-type MOS transistor 15 is provided between the photodiode section 12 and the N-type MOS transistor 16, the optical carriers are absorbed by the $N^+$-type buried diffused layer 5 and the N-type diffused layer 8 both having a high potential Vcc. Thus, the CMOS transistor section 13 is prevented from malfunctioning.

EXAMPLE 3

Figure 3:
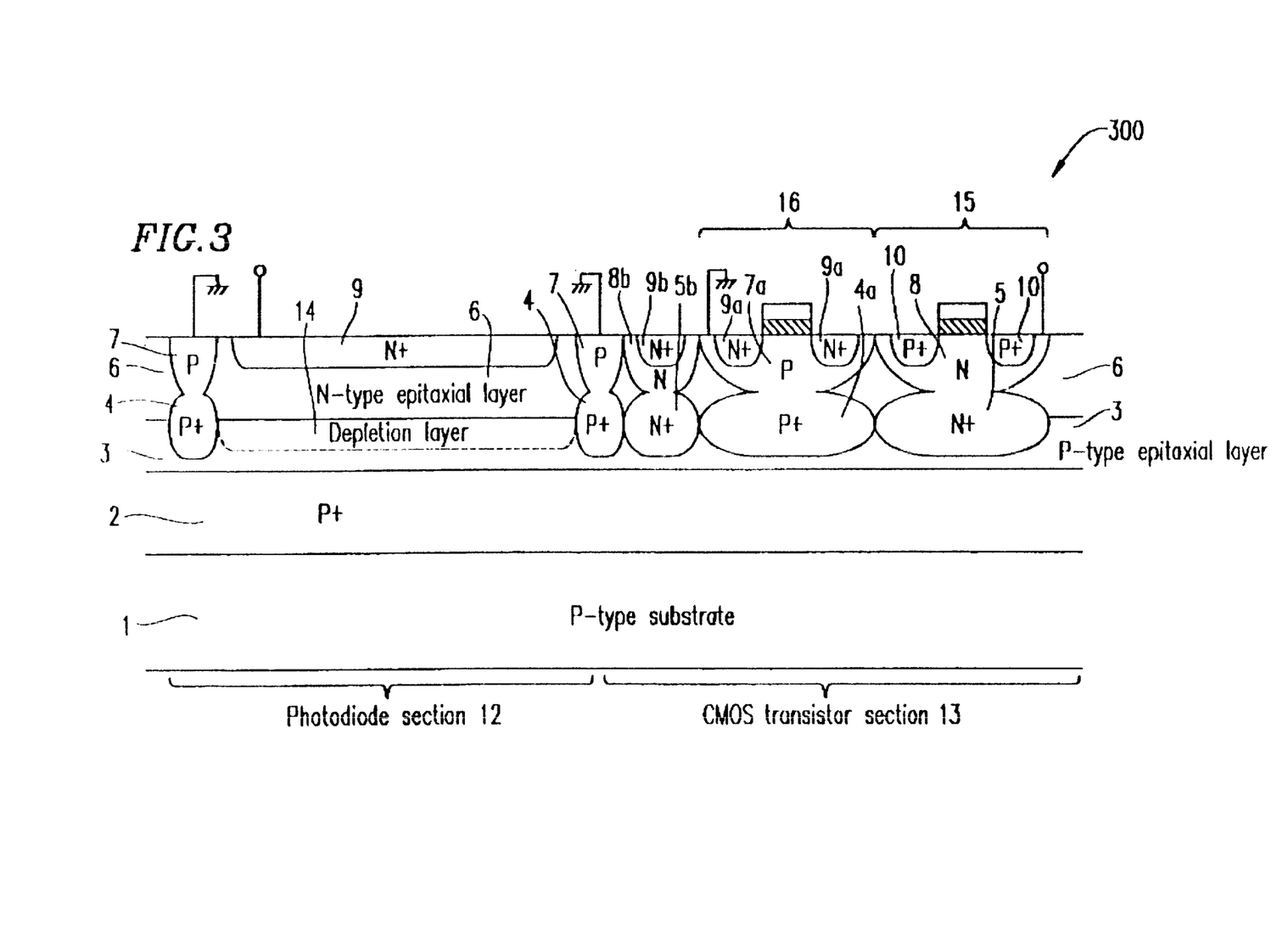
FIG. 3 is a cross-sectional view illustrating a structure of a light receiving device with a built-in circuit according to a third example of the present invention.

FIG. 3 is a cross-sectional view illustrating a light receiving device with a built-in circuit 300 according to a third example of the present invention.

The light receiving device with a built-in circuit 300 includes an N-type MOS transistor 16 of the CMOS transistor section 13 between the P-type MOS transistor 15 and the photodiode section 12. An $N^+$-type buried diffused layer 5b is provided between the N-type MOS transistor 16 and the $P^+$-type buried isolating diffused layer 4/P-type isolating diffused layer 7. The $N^+$-type buried diffusion layer 5b is provided in the P-type epitaxial layer 3 and the N-type epitaxial layer 6 across an interface between the layers 3 and 6. An N-type diffused layer 8b is provided on the $N^+$-type buried diffused layer 5b. An $N^+$-type diffused layer 9b is provided at a surface of the N-type diffused layer 8b. A surface of the $N^+$-type diffused layer 9b is exposed at the same level as the surface of the N-type diffused layer 8b. The light receiving device with a built-in circuit 300 has a similar structure to that of the light receiving device with a built-in circuit 100 shown in FIG. 1 on the other points.

The $N^+$-type buried diffused layer 5b, the N-type diffused layer 8b and the $N^+$-type diffused layer 9b may have an equal potential to that of the $P^+$-type buried isolating diffused layer 4 or may have a potential as high as the supply voltage Vcc.

As described above, the N-type MOS transistor 16 is proximate to the photodiode section 12. However, the $N^+$-type buried diffusion layer 5b, the N-type diffused layer 8b and the $N^+$-type diffused layer 9b, which are provided between the N-type MOS transistor 16 and the photodiode section 12, absorb the stray optical carriers migrating from the photodiode section 12. Therefore, the optical carriers are prevented with certainty from entering the channel region of the N-type MOS transistor 16, and thus the CMOS transistor section 13 is prevented from malfunctioning.

EXAMPLE 4

Figure 4:
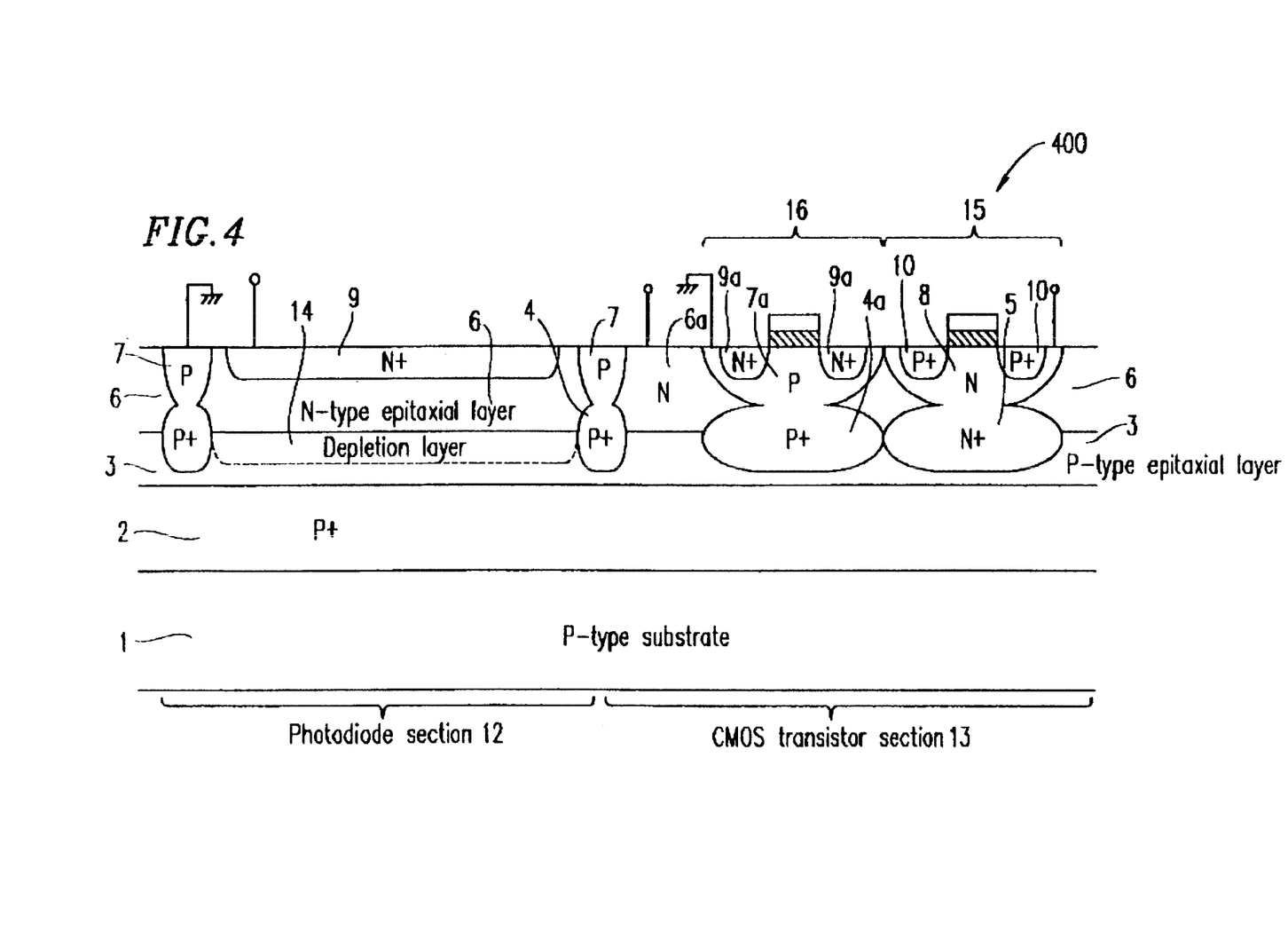
FIG. 4 is a cross-sectional view illustrating a structure of a light receiving device with a built-in circuit according to a fourth example of the present invention.

FIG. 4 is a cross-sectional view illustrating a light receiving device with a built-in circuit 400 according to a fourth example of the present invention.

The light receiving device with a built-in circuit 400 includes an N-type MOS transistor 16 of the CMOS transistor section 13 proximate to the photodiode section 12. An N-type epitaxial layer 6a (first second conductivity type semiconductor layer) is provided on the P-type epitaxial layer 3 between the N-type MOS transistor 16 and the $P^+$-type buried isolating diffused layer 4/P-type isolating diffused layer 7. The light receiving device with a built-in circuit 400 has a similar structure to that of the light receiving device with a built-in circuit 100 shown in FIG. 1 on the other points.

The N-type epitaxial layer 6a may have an equal potential to that of the $P^+$-type buried isolating diffused layers 4 and 4a or may have a potential as high as the supply voltage Vcc.

Due to the N-type epitaxial layer 6a provided between the N-type MOS transistor 16 and the photodiode section 12, the stray optical carriers migrating from the photodiode section 12 toward the N-type MOS transistor 16 are captured by a P-N junction region generated by the N-type epitaxial layer 6a and the $P^+$-type buried isolating diffused layer 4/P-type isolating diffused layer 7, and are recombined with holes and thus disappear. As a result, the optical carriers are prevented with certainty from entering the channel region of the N-type MOS transistor 16, and thus the CMOS transistor section 13 is prevented from malfunctioning.

EXAMPLE 5

Figure 5:
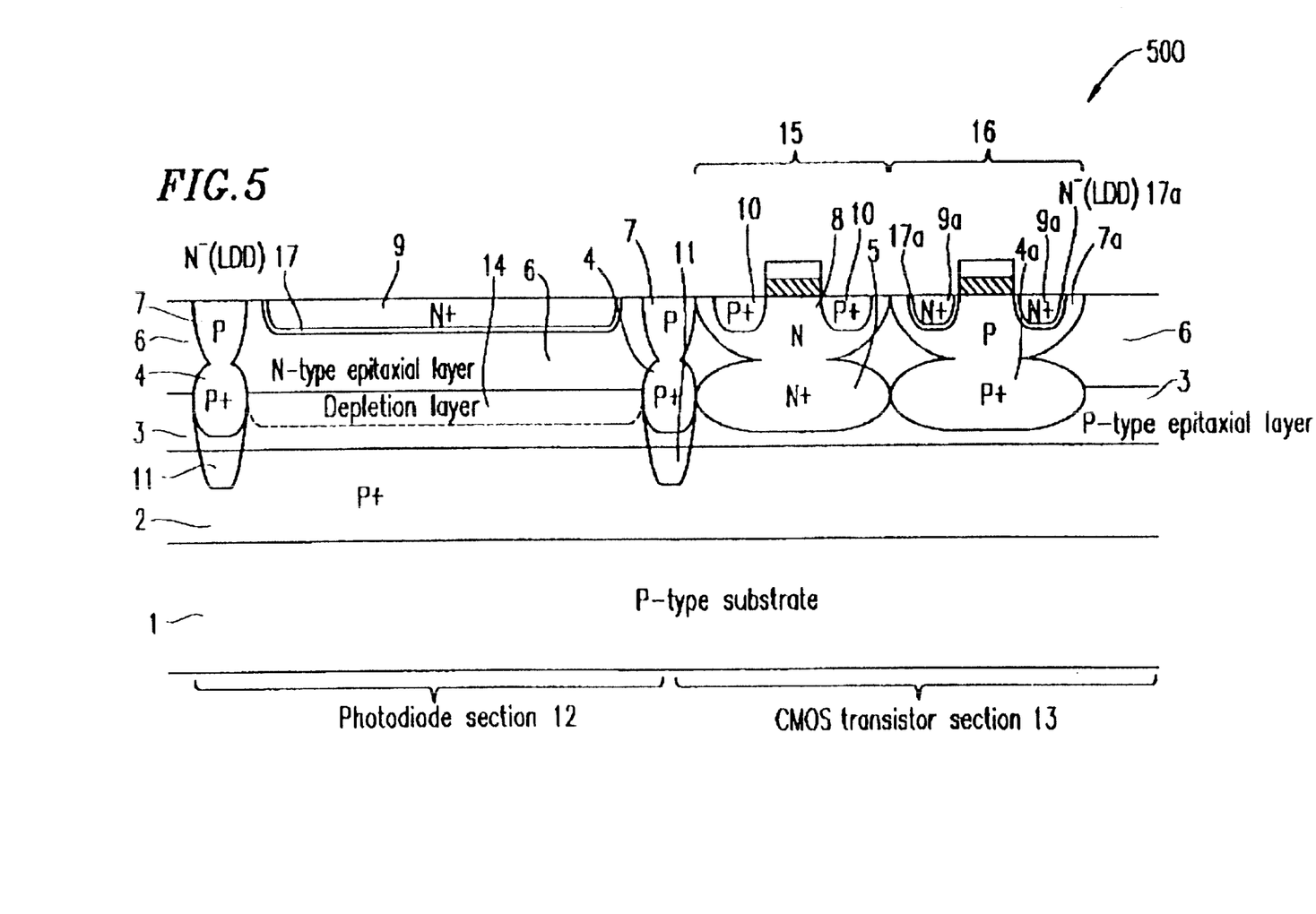
FIG. 5 is a cross-sectional view illustrating a structure of a light receiving device with a built-in circuit according to a fifth example of the present invention.

FIG. 5 is a cross-sectional view illustrating a light receiving device with a built-in circuit 500 according to a fifth example of the present invention.

The light receiving device with a built-in circuit 500 includes a P-type buried isolating diffused layer 11 below the $P^+$-type buried isolating diffused layer 4 surrounding the photodiode section 12. An $N^-$-type LDD (lightly doped drain) diffused layer 17 is provided at an interface between the N-type epitaxial layer 6 and the $N^+$-type diffused layer 9 of the photodiode section 12. An $N^-$-type LDD diffused layer 17a is provided at an interface between the P-type isolating diffused layer 7a and each of the $N^+$-type diffused layers 9a acting as a source region and a drain region of the N-type MOS transistor 16 in the CMOS transistor section 13. Each $N^-$-type LDD diffused layer 17, 17a is formed in the step of forming the $N^+$-type diffused layer 9, 9a by double diffusion, namely, by diffusing impurities to positions of a plurality of depths from a surface of the $N^+$-type diffused layer 9, 9a. The light receiving device with a built-in circuit 500 has a similar structure to that of the light receiving device with a built-in circuit 100 shown in FIG. 1 on the other points.

Figure 6:
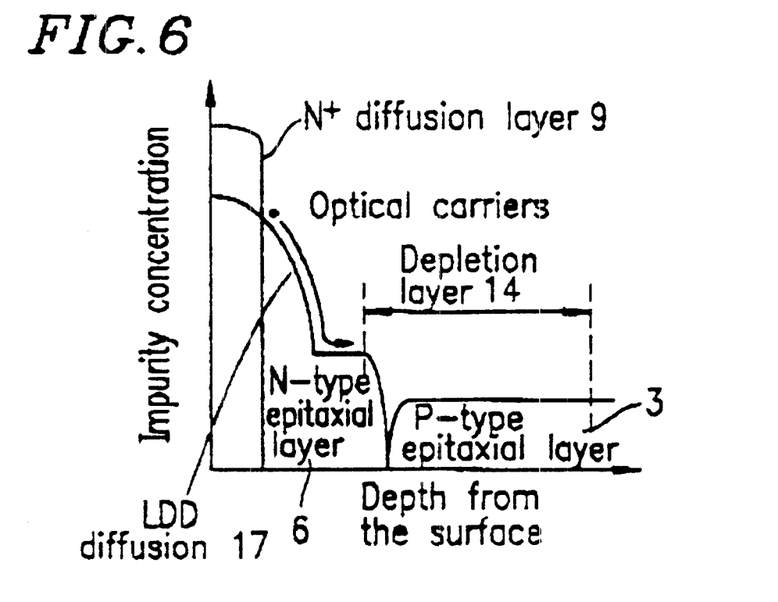
FIG. 6 is a graph illustrating a profile of the impurity concentration of a photodiode section of the light receiving device with a built-in circuit shown in FIG. 5 in a depth direction thereof.

The light receiving device with a built-in circuit 500 having the above-described structure functions as follows as shown in FIG. 6.

Specifically, a great number of optical carriers, which are generated in the vicinity of the surface of the photodiode section 12 by incident light having a short wavelength, are accelerated toward the inside of the photodiode section 12 by a built-in electric field generated by a profile of the impurity concentration of the N⁻-type LDD diffused layer 17. The optical carriers then migrate toward the depletion layer 14 at an interface between the N-type epitaxial layer 6 and the P-type epitaxial layer 3 at a high speed. Therefore, the migration time of the optical carriers in the regions of the photodiode section 12 other than the depletion layer 14 is shortened, and thus the photodiode section 12 operates at a higher speed.

Due to an LDD structure of having the N⁻-type LDD diffused layer 17a, the N-type MOS transistor 16 of the CMOS transistor section 13 has an improved voltage-withstanding characteristic. The P-type MOS transistor 15 need not have the LDD structure since the hot carriers are highly reliable.

Below the N⁺-type diffused layer 9, the N-type epitaxial layer 6 in the photodiode section 12 may have a substantially uniform impurity concentration in the direction of a depth of the photodiode section 12 and may also have a high specific resistance. In this case, the specific resistance of the N-type epitaxial layer 6 is preferably about 3.0 Ω·cm or higher.

Figure 7:
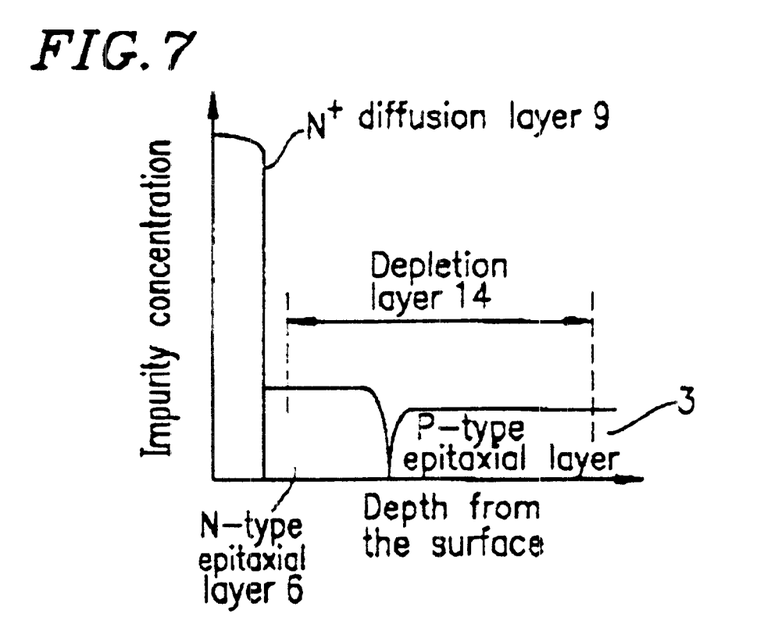
FIG. 7 is a graph illustrating a profile of the impurity concentration of another photodiode section in a depth direction thereof.

Here, it is assumed that, for example, the N-type epitaxial layer 6 has a thickness of about 1.9 μm and a specific resistance of about 3.0 Ω·cm; the N⁺-type diffused layer 9 is diffused to a position of a depth of about 0.4 μm from the surface of the N-type epitaxial layer 6; and the photodiode section 12 is supplied with a bias voltage of about 1.5 V. In this case, the depletion layer 14 between the N-type epitaxial layer 6 and the P-type epitaxial layer 3 expands to a height of about 1.4 μm. As a result, a top portion of the depletion layer 14 contacts a bottom face of the N⁺-type diffused layer 9. In this case, as shown in FIG. 7, the depletion layer 14 expands to the N⁺-type diffused layer 9. As a result, the migration time of the original carriers in the regions of the photodiode section 12 other than the depletion layer 14 is shortened, and thus the photodiode section 12 operates at a higher speed.

Even when the specific resistance of the N-type epitaxial layer 6 cannot be sufficiently high for the reasons regarding characteristics of the CMOS transistor section 13, the response speed of the photodiode section 12 can be improved by the N⁻-type LDD diffused layer 17 formed of impurities diffused below the N⁺-type diffused layer 9.

Instead of the N⁺-type LDD diffused layer 17, an N-type well diffused layer, such as, for example, an N⁺-type buried diffused layer may be provided below the N⁺-type diffused layer 9. In such a structure, the optical carriers act by a similar principle to that of LDD diffusion described above with reference to FIG. 6. Namely, the optical carriers are accelerated toward the inside of the photodiode section 12 by a built-in electric field generated by a profile the impurity concentration of the N-type well diffused layer, and thus migrate toward the depletion layer 14 at an interface between the N-type epitaxial layer 6 and the P-type epitaxial layer 3 at a high speed. Therefore, the migration time of the optical carriers in the regions of the photodiode section 12 other than the depletion layer 14 is shortened, and thus the photodiode section 12 operates at a higher speed.

In a usual MOS process for producing a semiconductor device with no built-in photodiode, a P-well diffused layer and an N-well diffused layer are formed in a self-aligned manner using a single mask. In the case where no N-type well diffused layer, such as, for example, an N⁺-type buried diffused layer is formed in the photodiode section 12, one more mask is needed for covering the photodiode section 12 when forming an N-well diffused layer in the CMOS transistor section 13. By contrast, in the case where an N-type well diffused layer, such as, for example, an N⁺-type buried diffused layer is provided below the N⁺-type diffused layer 9, a mask for covering the photodiode section 12 is not required when forming an N-well diffused layer in the CMOS transistor section 13. Therefore, the number of steps of producing the light receiving device with a built-in circuit 500 is reduced.

EXAMPLE 6

Figure 8:
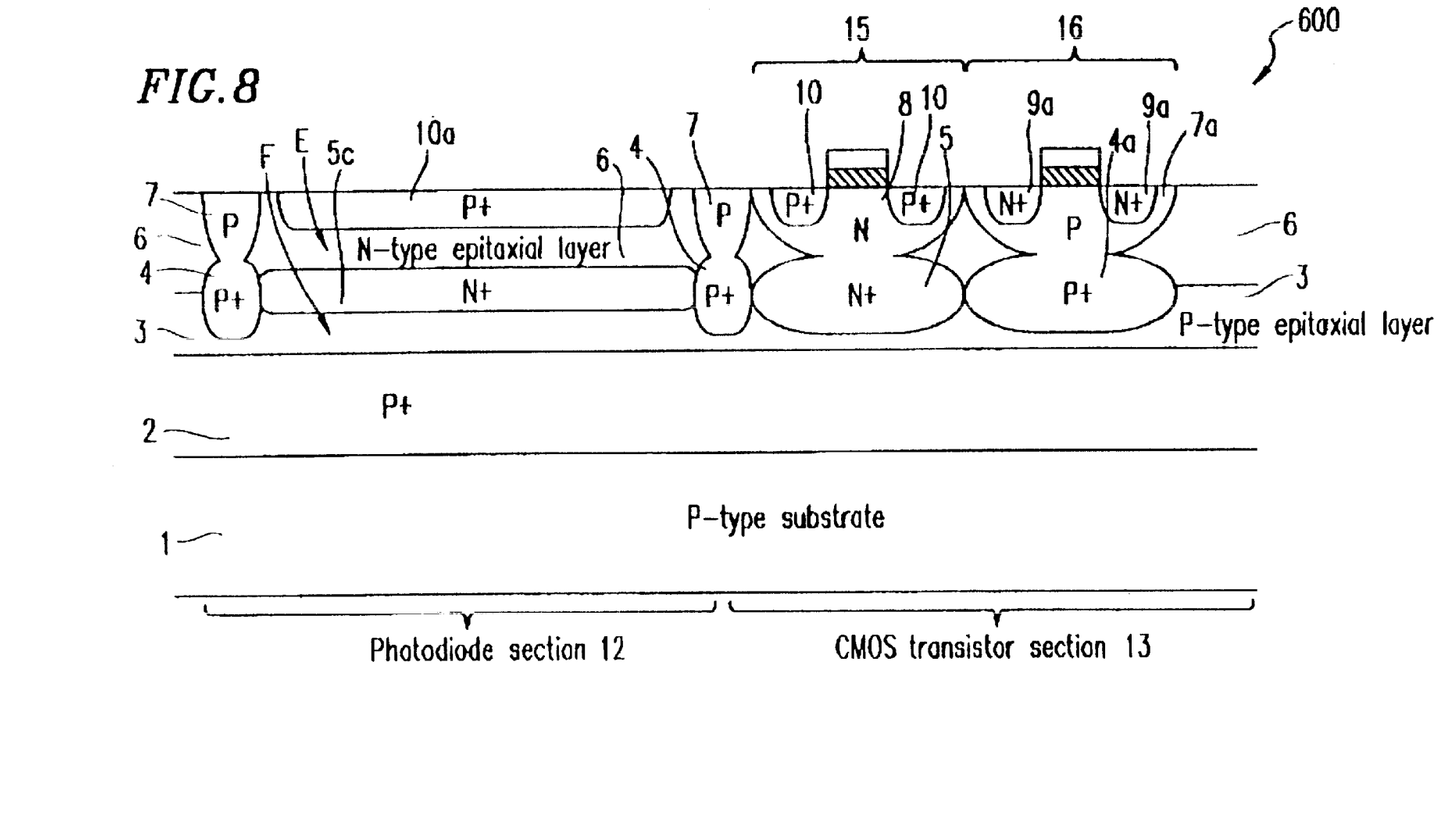
FIG. 8 is a cross-sectional view illustrating a structure of a light receiving device with a built-in circuit according to a sixth example of the present invention.

FIG. 8 is a cross-sectional view illustrating a light receiving device with a built-in circuit 600 according to a sixth example of the present invention.

Figure 9:
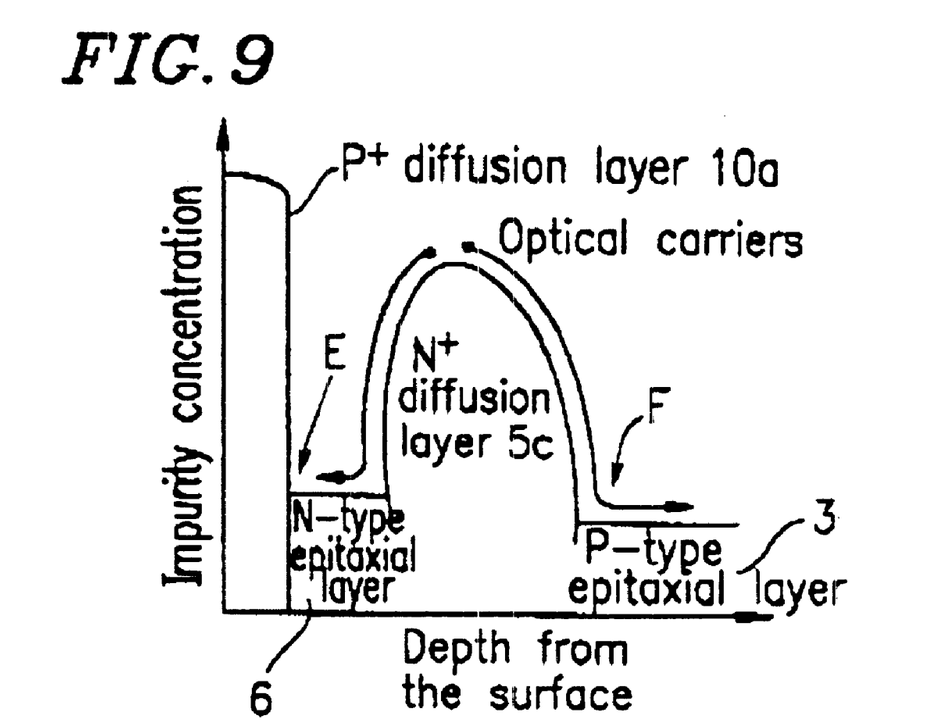
FIG. 9 is a graph illustrating a profile of the impurity concentration of a photodiode section of the light receiving device with a built-in circuit shown in FIG. 8 in a depth direction thereof.

The light receiving device with a built-in circuit 600 includes an N⁺-type buried diffused layer 5c (a third second conductivity type semiconductor layer) provided between the N-type epitaxial layer 6 and the P-type epitaxial layer 3 in the photodiode section 12. A P⁺-type diffused layer 10a (a sixth first conductivity type semiconductor layer) is provided at the surface of the N-type epitaxial layer 6. In such a structure, as shown in FIG. 9, a photodiode E including the P⁺-type diffused layer 10a and the N⁺-type buried diffused layer 5c is formed in the vicinity of the surface of the photodiode section 12. A photodiode F including the N⁺-type buried diffused layer 5c and the P-type epitaxial layer 3 is formed below the photodiode E.

The light receiving device with a built-in circuit 600 functions as follows.

Due to a potential barrier generated by a profile of the impurity concentration of the N⁺-type buried diffused layer 5c, optical carriers which are generated at a position shallower than a peak position of the N⁺-type buried diffused layer 5c are detected by the photodiode E, and optical carriers which are generated at a position deeper than the peak position of the N⁺-type buried diffused layer 5c are detected by the photodiode F. As a result, the photodiode section 12 shown in FIG. 8 can detect light having a short wavelength and light having a long wavelength separately.

For example, light incident on the photodiode section 12 having a wavelength of 400 nm penetrates into in the photodiode section 12 down to a position of a depth of about 1 μm or less from the surface of the photodiode section 12. Therefore, all optical carriers generated by the incident light are absorbed by the photodiode E. When the N-type epitaxial layer 6 has a thickness of about 1.5 μm and the incident light has a wavelength of 650 nm, about 30% of optical carriers generated by the incident light are absorbed by the photodiode E, and about 70% of the optical carriers are absorbed by the photodiode F. Utilizing this, the wavelength of the incident light can be detected by calculating a different between the magnitude of the photocurrent generated in the photodiode E by the incident light and the magnitude of the photocurrent generated in the photodiode F by the incident light.

Herein, the P-type is referred to as a first conductivity type and the N-type is referred to as a second conductivity type. In structures other than those of the third and fourth examples shown in FIGS. 3 and 4, the N-type may be the first conductivity type, and the P-type may be the second conductivity type.

A light receiving device with a built-in circuit according to the present invention includes a photodiode having a small junction capacitance due to a first second conductivity type semiconductor layer and a second first conductivity type semiconductor layer. The photodiode is surrounded by a third first conductivity type semiconductor layer and a fourth first conductivity type semiconductor layer and thus is electrically separated from an signal processing circuit including a MOS transistor. Therefore, the photodiode can operate at a high speed and acquires an improved level of photosensitivity to light having a short wavelength. In addition, optical carriers generated in the photodiode are prevented from entering the MOS transistor, and a latch-up phenomenon is prevented.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light receiving device with a built-in circuit, comprising:
    a first conductivity type semiconductor lamination structure;
    a photodiode for converting light incident thereon to an electric signal by a junction with a first second conductivity type semiconductor layer provided on the first conductivity type semiconductor lamination structure for processing the electric signal obtained by the photoelectric conversion; and
    a signal processing circuit provided in a region different from the photodiode,
    wherein:
        the first conductivity type semiconductor lamination structure includes:
        a first conductivity type semiconductor substrate,
        a first first conductivity type semiconductor layer provided on the first conductivity type semiconductor substrate and having a higher impurity concentration than the first conductivity type semiconductor substrate, and
        a second first conductivity type semiconductor layer provided on the first first conductivity type semiconductor layer and having a lower impurity concentration than that of the first first conductivity type semiconductor layer,
        wherein the photodiode is provided in a region surrounded by a third first conductivity type semiconductor layer provided so as to substantially contact a surface of the first first conductivity type semiconductor layer and a fourth conductivity type semiconductor layer extended from a surface of the first second conductivity type semiconductor layer so as to reach the third first conductivity type semiconductor layer, and
        wherein the signal processing circuit includes at least a MOS structure transistor.

2. A light receiving device with a built-in circuit according to claim 1, further comprising a fifth first conductivity type semiconductor layer provided below the third first conductivity type semiconductor layer in the state of overlapping at least a portion of the third first conductivity type semiconductor layer, the fifth first conductivity type semiconductor layer running through the second first conductivity type semiconductor layer and reaching at least the first first conductivity type semiconductor layer.

3. A light receiving device with a built-in circuit according to claim 1, wherein the second first conductivity type semiconductor layer has a high specific resistance.

4. A light receiving device with a built-in circuit according to claim 1, wherein the second first conductivity type semiconductor layer has a specific resistance of 200 Ω·cm or more.

5. A light receiving device with a built-in circuit according to claim 1, further comprising a second second conductivity type semiconductor layer at a surface of the first second conductivity type semiconductor layer.

6. A light receiving device with a built-in circuit according to claim 1, wherein the signal processing section includes an N-type MOS transistor provided so as not to be adjacent to the photodiode.

7. A light receiving device with a built-in circuit according to claim 6, wherein the signal processing section further includes a P-type MOS transistor between the N-type MOS transistor and the photodiode.

8. A light receiving device with a built-in circuit according to claim 6, wherein:
    the signal processing section includes one of the first second conductivity type semiconductor layer and the second second conductivity type semiconductor layer between the N-type MOS transistor and the photodiode, and
    the one of the first second conductivity type semiconductor layer and the second second conductivity type semiconductor layer is set to be at an equal potential to that of the third first conductivity type semiconductor layer.

9. A light receiving device with a built-in circuit according to claim 6, wherein:
    the signal processing section includes one of the first second conductivity type semiconductor layer and the second second conductivity type semiconductor layer between the N-type MOS transistor and the photodiode, and
    the one of the first second conductivity type semiconductor layer and the second second conductivity type semiconductor layer is set to be at a higher potential than that of the third first conductivity type semiconductor layer.

10. A light receiving device with a built-in circuit according to claim 1, wherein the second second conductivity type semiconductor layer is obtained as a result of performing a step of forming a source region and a drain region of the MOS structure transistor.

11. A light receiving device with a built-in circuit according to claim 10, wherein the second second conductivity type semiconductor layer is obtained as a result of diffusion processing performed at least once.

12. A light receiving device with a built-in circuit according to claim 10, further comprising a sixth first conductivity type semiconductor layer at a surface of the first second conductivity type semiconductor layer.

13. A light receiving device with a built-in circuit according to claim 10, wherein the first second conductivity type semiconductor layer has a substantially uniform impurity concentration in a region below the second second conductivity type semiconductor layer.

14. A light receiving device with a built-in circuit according to claim 1, wherein the first second conductivity type semiconductor layer has a high specific resistance.

15. A light receiving device with a built-in circuit according to claim 1, wherein the first second conductivity type semiconductor layer has a specific resistance of 3.0 Ω·cm or higher.

16. A light receiving device with a built-in circuit according to claim 5, further comprising a second conductivity type well diffused layer below the second second conductivity type semiconductor layer.

17. A light receiving device with a built-in circuit according to claim 12, further comprising a first conductivity type well diffused below the sixth first conductivity type semiconductor layer.

18. A light receiving device with a built-in circuit according to claim 16, wherein the second conductivity type well diffused layer is obtained as a result of performing a step of forming a well region of the MOS structure transistor.

19. A light receiving device with a built-in circuit according to claim 17, wherein the first conductivity type well diffused layer is obtained as a result of performing a step of forming a well region of the MOS structure transistor.

20. A light receiving device with a built-in circuit according to claim 17, further comprising a third second conductivity type semiconductor layer between the first second conductivity type semiconductor layer and the second first conductivity type semiconductor layer.

* * * * *